United States Patent
Yu

(10) Patent No.: US 12,402,254 B2
(45) Date of Patent: Aug. 26, 2025

(54) ANISOTROPIC CONDUCTIVE STRUCTURE, LENS MODULE AND ELECTRONIC DEVICE

(71) Applicant: TRIPLE WIN TECHNOLOGY(SHENZHEN) CO.LTD., Shenzhen (CN)

(72) Inventor: Fei-Fan Yu, Shenzhen (CN)

(73) Assignee: TRIPLE WIN TECHNOLOGY(SHENZHEN) CO.LTD., Shenzhen (CN)

( * ) Notice: Subject to any disclaimer, the term of this patent is extended or adjusted under 35 U.S.C. 154(b) by 207 days.

(21) Appl. No.: 18/368,740

(22) Filed: Sep. 15, 2023

(65) Prior Publication Data
US 2024/0292545 A1    Aug. 29, 2024

(30) Foreign Application Priority Data
Feb. 23, 2023    (CN) .......................... 202310199103.4

(51) Int. Cl.
 *H05K 3/32* (2006.01)
 *C09J 9/02* (2006.01)
 *H01R 11/01* (2006.01)

(52) U.S. Cl.
 CPC ................ *H05K 3/323* (2013.01); *C09J 9/02* (2013.01); *H01R 11/01* (2013.01)

(58) Field of Classification Search
 CPC ............. H05K 3/32; H05K 3/323; C09J 9/02; H01R 11/01
 USPC ......................................................... 174/259
 See application file for complete search history.

(56) References Cited

FOREIGN PATENT DOCUMENTS

CN    105974695    9/2016

*Primary Examiner* — Tremesha W Burns
(74) *Attorney, Agent, or Firm* — ScienBiziP, P.C.

(57) ABSTRACT

An anisotropic conductive structure includes a first element, a second element, and an anisotropic conductive film (ACF) arranged between the first element and the second element. The anisotropic conductive structure can balance the height difference caused by the electrical connection portion, which can prevent tilt and open circuit. A lens module and an electronic device carrying the lens module are also provided.

20 Claims, 8 Drawing Sheets

ANISOTROPIC CONDUCTIVE STRUCTURE, LENS MODULE AND ELECTRONIC DEVICE

FIELD

The subject matter herein generally relates to optical imaging, and more particularly, to an anisotropic conductive structure, a lens module having the anisotropic conductive structure, and an electronic device having the lens module.

BACKGROUND

An anisotropic conductive film (ACF) is usually used in a lens module to bond and electrically connect components of the lens module to each other, and the components may be a circuit board and a chip. The existing ACF includes an adhesive layer and a number of conductive particles distributed in the adhesive layer. When in use, the ACF is pressed, so that the conductive particles between the pads of the components located on both sides of the ACF are squeezed and deformed, and the pads of the components are electrically conducted to each other by the conductive particles.

However, the conductive particles are not uniformly distributed in the adhesive layer. When the pads are small, the number of conductive particles corresponding the pads may not be enough to electrically connect the pads to each other, resulting in an open circuit.

In addition, since the pad of the component has a certain height, there is a gap between the conductive particles outside the pads and the component. The component may be inclined under the pressure due to the existence of the gap, which causes uneven force applied on the components, so that the conductive particles cannot electrically connect the components to each other, thereby forming an open circuit and resulting in quality problems.

Therefore, there is room for improvement in the art.

BRIEF DESCRIPTION OF THE DRAWINGS

Implementations of the present disclosure will now be described, by way of embodiments only, with reference to the attached figures.

DETAILED DESCRIPTION

Figure 1:
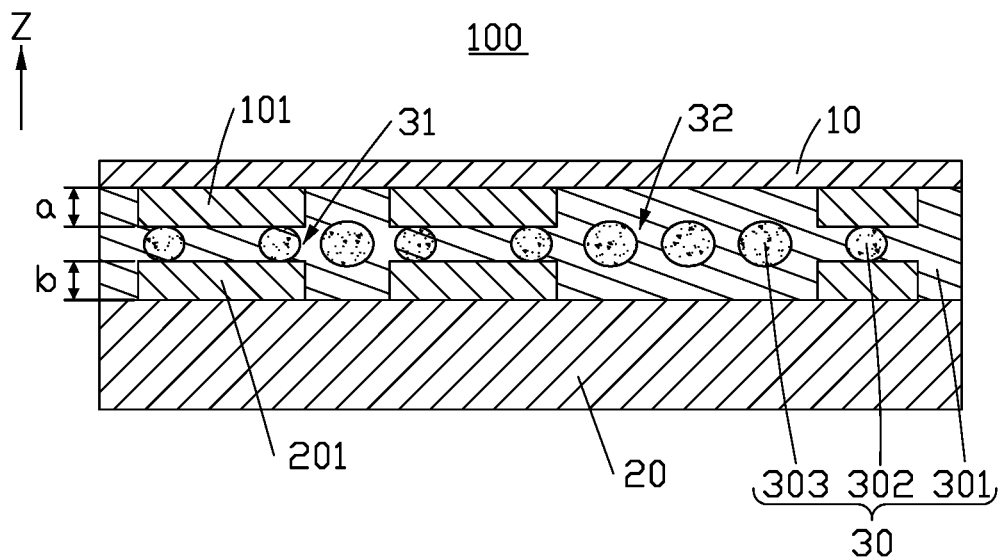
FIG. 1 is a cross-sectional view of an anisotropic conductive structure according to an embodiment of the present disclosure.

Unless otherwise defined, all technical and scientific terms used herein have the same meaning as commonly understood by persons skill in the art. The terms used herein are only for the purpose of describing specific embodiments, and not intended to limit the embodiments of the present application.

The embodiments of the present application are described here with reference to sectional views, which are schematic diagrams of idealized embodiments (and intermediate structures) of the present application. Therefore, the difference in the shape of the drawing due to the manufacturing process and/or tolerance is predictable. Accordingly, the embodiments of the present application should not be interpreted as limited to the specific shape of the area illustrated here, but should include, for example, the deviation of the shape due to manufacturing. The areas shown in the drawings are only schematic, and their shape is not used to illustrate the actual shape of the device, and is not used to limit the scope of the present disclosure.

Some embodiments of the present application will be described in detail below with reference to the drawings. The following embodiments and features of the embodiments may be combined with each other in the absence of conflict.

Referring to FIG. 1, an embodiment of the present application provides an anisotropic conductive structure 100, which includes a first element 10, a second element 20, and an anisotropic conductive film (ACF) 30 arranged between the first element 10 and the second element 20. The ACF 30 electrically connects the first element 10 to the second element 20. The first component 10 includes at least one first electrical connection portion 101 for electrically connecting the first component 10 to other components. The number of the first electrical connection portion 101 may be one or more, which is not limited in this application. The second component 20 includes at least one second electrical connection portion 201 for electrically connecting the second component 20 to other components. Along the thickness direction z of the anisotropic conductive structure 100 (that is, the thickness direction of the first element 10, the second element 20, and the anisotropic conductive film 30), the second electrical connection portion 201 faces the first electrical connection portion 101. That is, along the thickness direction z, the orthogonal projection of the second electrical connection portion 201 overlaps with that of the first electrical connection portion 101. In another embodiment, the orthogonal projection of the second electrical connection portion 201 completely covers that of the first electrical portion 101. In yet another embodiment, the orthogonal projection of the first electrical connection portion 101 completely covers that of the second electrical connection portion 201.

Figure 2:
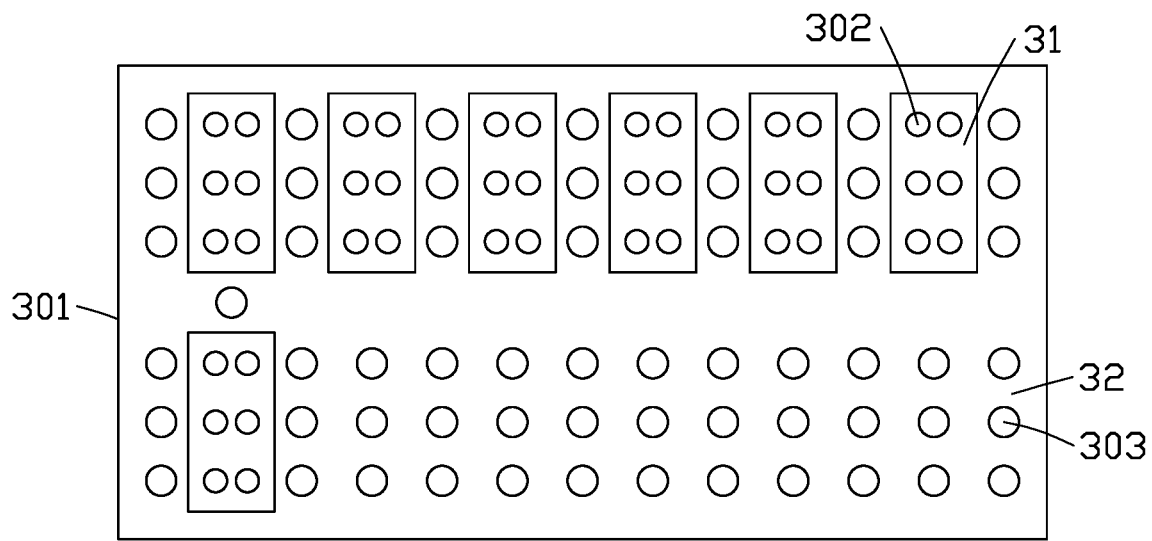
FIG. 2 is a top diagrammatic view of an anisotropic conductive film of the anisotropic conductive structure of FIG. 1.

As shown in FIG. 2, the ACF 30 includes an adhesive layer 301, a plurality of first conductive particles 302, and a plurality of second conductive particles 303. The plurality of first conductive particles 302 and the plurality of second conductive particles 303 are distributed in the adhesive layer 301. The diameter of the first conductive particles 302 is denoted as R1, and the diameter of the second conductive particles is denoted as R2, and R2>R1. The ACF 30 electrically connects the first electrical connection portion 101 to the second electrical connection portion 201. The ACF 30 includes a first region 31 and a second region 32 connected to the first region 31. The first region 31 and the second region 32 are connected to each other along an extending direction X of the ACF 30 perpendicular to the thickness direction Z. The first region 31 corresponds to the first electrical connection portion 101 and the second electrical connection portion 201, and the second region 32 does not corresponds to the first electrical connection portion 101 or the second electrical connection portion 201. The first region 31 refers to the area of the ACF 30 covered by the orthogonal projections of the first electrical connection portion 101 and the second electrical connection portion 201. The first conductive particles 302 are located in the first region 31, and the second conductive particles 303 are located in the second region 32. That is, the first conductive particles 302 with a small particle size are disposed corresponding to the electrical connection portion, and the second conductive particles 303 with a large particle size are not disposed corresponding to the electrical connection portion.

Along the thickness direction z, the height of the first electrical connection portion 101 is denoted as "a", and the height of the second electrical connection portion 201 is denoted as "b", wherein R1×60%+a+b≤R2≤R1×70%+a+b.

For example, the height "a" of the first electrical connection portion 101 is 30 μm, the height "b" of the second electrical connection portion 201 is 30 μm, the diameter "R1" of the first conductive particle 302 is 20 μm, then the minimum value of the diameter "R2" of the second conductive particle 303 is "20×60%+30+30", that is, 72 μm, and the maximum value of the diameter "R2" of the second conductive particle 303 is "20×70%+30+30", that is, 74 μm. In other words, the diameter of the second conductive particle 303 ranges from 72 μm to 74 μm.

In the anisotropic conductive structure 100 of the present application, the first conductive particles 302 with a small particle size are arranged in the area corresponding to the electrical connection portion, and the second conductive particles 303 with a large particle size are arranged in the area outside the electrical connection portion. As such, the height difference caused by the electrical connection portion is balanced, which can prevent the tilt of the first element 10 and the second element 20 under an external force. Moreover, the height "a" of the first electrical connection portion 101, the height "b" of the second electrical connection portion 201, the diameter "R1" of the first conductive particle 302, and the diameter "R2" of the second conductive particle 303 satisfy the following formula: R1×60%+a+b≤R2≤R1×70%+a+b. By limiting the lower limit of the diameter "R2" of the second conductive particles 303, the degree of tilt can be reduced, and the first element 10 and the second element 20 can be evenly stressed, thereby allowing the external force to be evenly applied onto the first and second electrical connection portions 101, 201. Thus, the problem caused by the open circuit can be avoided. In addition, by limiting the upper limit of the diameter "R2" of the second conductive particles 303, the second conductive particles 303 are prevented from electrically connecting the areas other than the electrical connection portions of the first and second elements, thus avoiding a short circuit.

Figure 3:
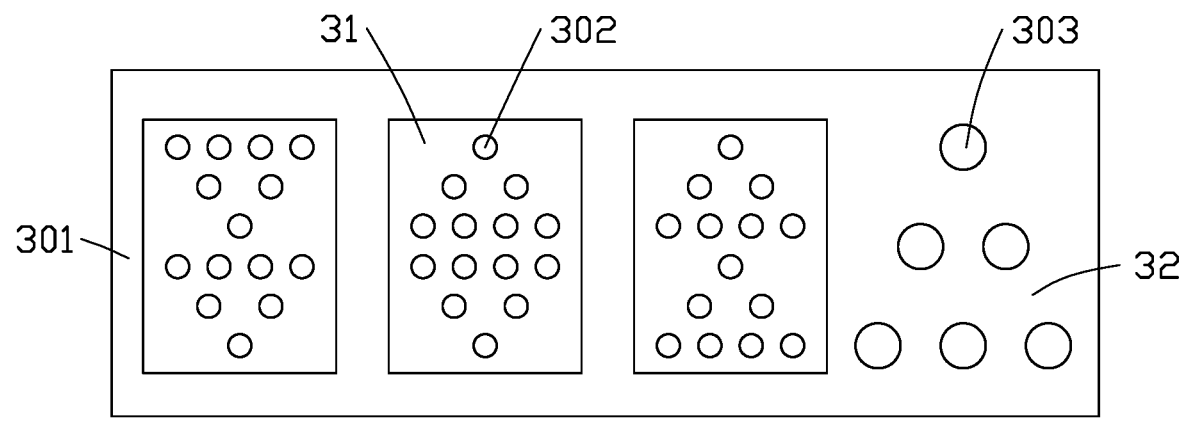
FIG. 3 is similar to FIG. 2 but showing the anisotropic conductive film according to a second embodiment of the present disclosure.
Figure 4:
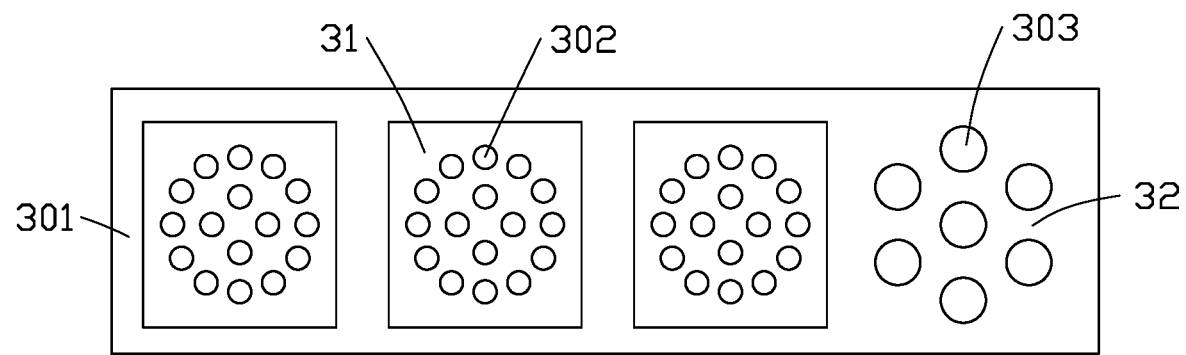
FIG. 4 is similar to FIG. 2 but showing the anisotropic conductive film according to a third embodiment of the present disclosure.
Figure 5:
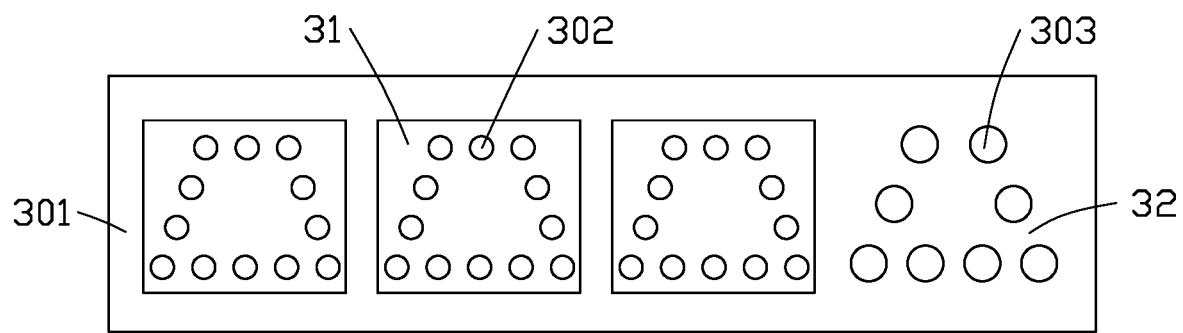
FIG. 5 is similar to FIG. 2 but showing the anisotropic conductive film according to a fourth embodiment of the present disclosure.

In some embodiments, the first conductive particles 302 are arranged in the first region 31 according to a first preset pattern. The first preset pattern may be, but not limited to, rectangle, circle, ellipse, triangle or trapezoid. FIG. 2 shows that the first preset pattern is a rectangle, that is, the first conductive particles 302 are arranged in a rectangle. As shown in FIG. 3, the first conductive particles 302 are arranged in a triangle. As shown in FIG. 4, the first conductive particles 302 are arranged in a circle or an ellipse. As shown in FIG. 5, the first conductive particles 302 are arranged in a trapezoid. In other embodiments, the first conductive particles 302 are arranged in irregular shapes. The shape and size of the first preset pattern can be adjusted according to the shapes and sizes of the first and second electrical connection portions 101, 201.

In some embodiments, the second conductive particles 303 are arranged in the second region 32 according to a second preset pattern. The second preset pattern may be, but not limited to, rectangle, circle, ellipse, triangle or trapezoid. FIG. 2 shows that the second preset pattern is a rectangle, that is, the second conductive particles 303 are arranged in a rectangle. As shown in FIG. 3, the second conductive particles 303 are arranged in a triangle. As shown in FIG. 4, the second conductive particles 303 are arranged in a circle or an ellipse. As shown in FIG. 5, the second conductive particles 303 are arranged in a trapezoid. In other embodiments, the second conductive particles 303 are arranged in irregular shapes. The shape and size of the second preset pattern can be adjusted according to the shapes and sizes of the first and second electrical connection portions 101, 201.

In some embodiments, the material of the first conductive particles 302 may be, but not limited to, gold, silver, tin, or indium.

In some embodiments, the material of the second conductive particles 303 may be, but not limited to, gold, silver, tin, or indium.

In some embodiments, the material of the adhesive layer 301 may be, but not limited to, epoxy resin, polymethyl methacrylate, or polyvinyl acetate.

In some embodiments, the first element 10 may be, but not limited to, a circuit board or a chip, and the second element 20 may be, but not limited to, a circuit board or a chip. The circuit board may be a printed circuit board (PCB) or a flexible printed circuit (FPC), which is not limited here. When the first element 10 is a circuit board, the first electrical connection portion 101 is a pad on the circuit board. When the second element 20 is a chip, the second electrical connection portion 201 is a pin on the chip.

Figure 6:
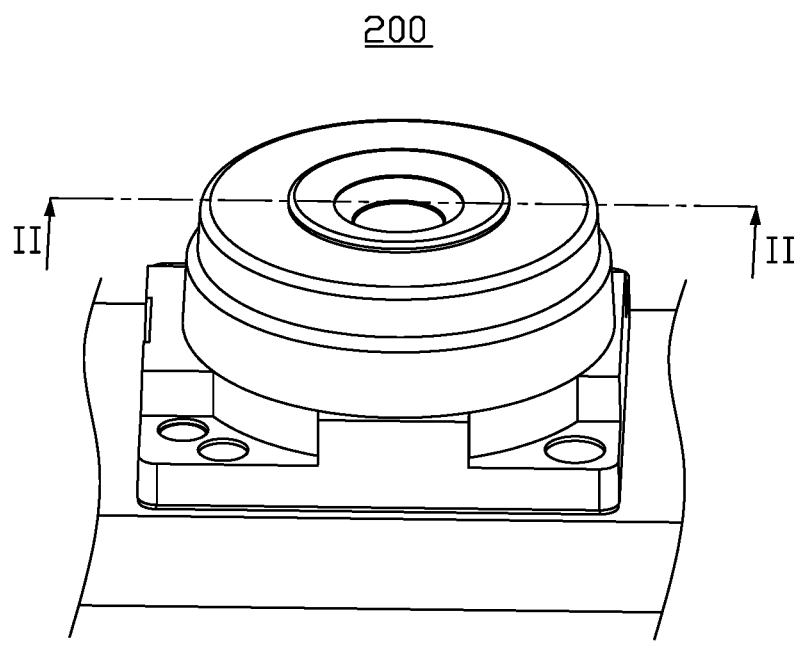
FIG. 6 is a diagrammatic view of a lens module according to an embodiment of the present disclosure.
Figure 7:
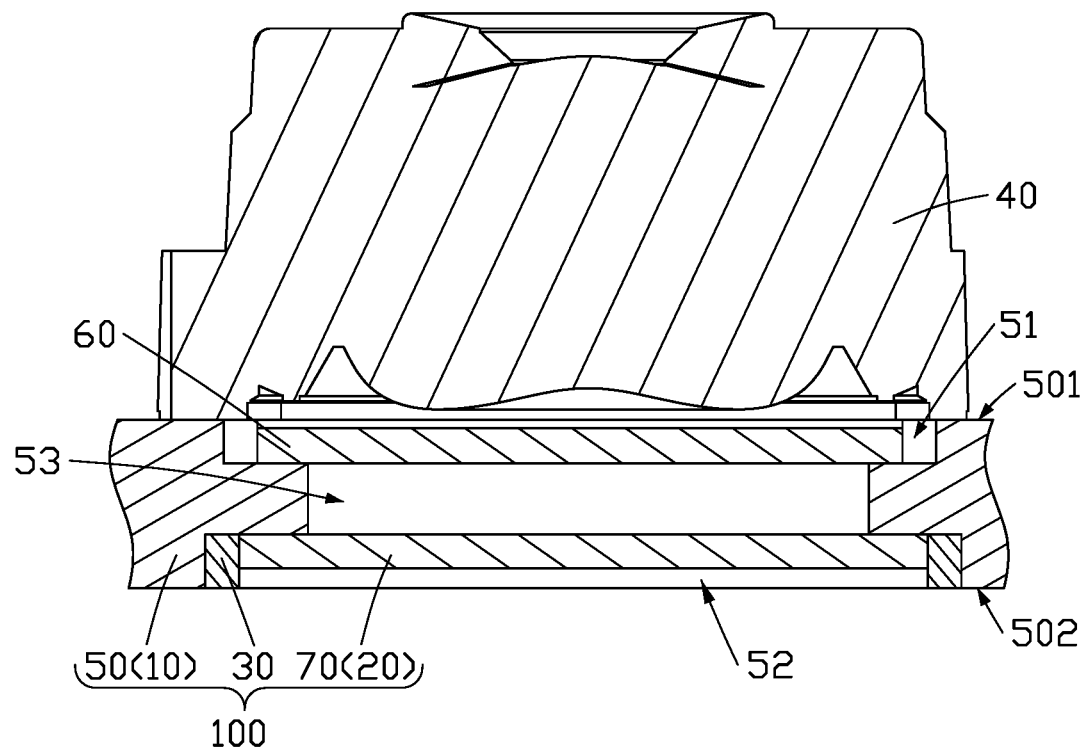
FIG. 7 is a cross-sectional view along II-II in FIG. 6.

Referring to FIGS. 6 and 7, an embodiment of the present application further provides a lens module 200 including the anisotropic conductive structure 100. The lens module 200 includes a lens 40, a circuit board 50, a filter 60, a photosensitive chip 70, and an ACF 30. The circuit board 50, the photosensitive chip 70, and the ACF 30 constitute the anisotropic conductive structure 100.

As shown in FIG. 7, the circuit board 50 includes a first surface 501 and a second surface 502 opposite to the first surface 501. The lens 40 is arranged on the first surface 501. A portion of the first surface 501 is recessed toward the second surface 502 to form a first groove 51, and a portion of the second surface 502 is recessed toward the first surface 501 to form a second groove 52. A portion of a bottom surface of the first groove 51 is further recessed toward a bottom surface of the second groove 52 to form a through hole 53. The first groove 51 and the second groove 52 communicate with each other by the through hole 53. The first groove 51, the second groove 52, and the through hole 53 can be formed by, but not limited to, laser beams or mechanical drilling. Orthographic projection of the lens 10 completely covers the first groove 51 or the second groove 52. The filter 60 is disposed on the bottom surface of the first groove 51. The photosensitive chip 70 is disposed on the bottom surface of the second groove 52, and is electrically connected with the circuit board 50 through the ACF 30. Thus, the total height of the lens module 200 is reduced. The filter 60 faces the photosensitive chip 70, and the filter 56 and the photosensitive chip 70 cover both ends of the through hole 33.

In this embodiment, the first component 10 is the circuit board 50, and the first electrical connection portion 101 is a pad (not shown) on the circuit board 50; the second component 20 is the photosensitive chip 70, and the second electrical connection portion 201 is a pin on the photosensitive chip 70 (not shown). In other embodiments, the first element 10 is the photosensitive chip 70, and the first electrical connection portion 101 is a pin on the photosensitive chip 70; the second element 20 is the circuit board 50, and the second electrical connection portion 201 is a pad on the circuit board 50.

Figure 8:
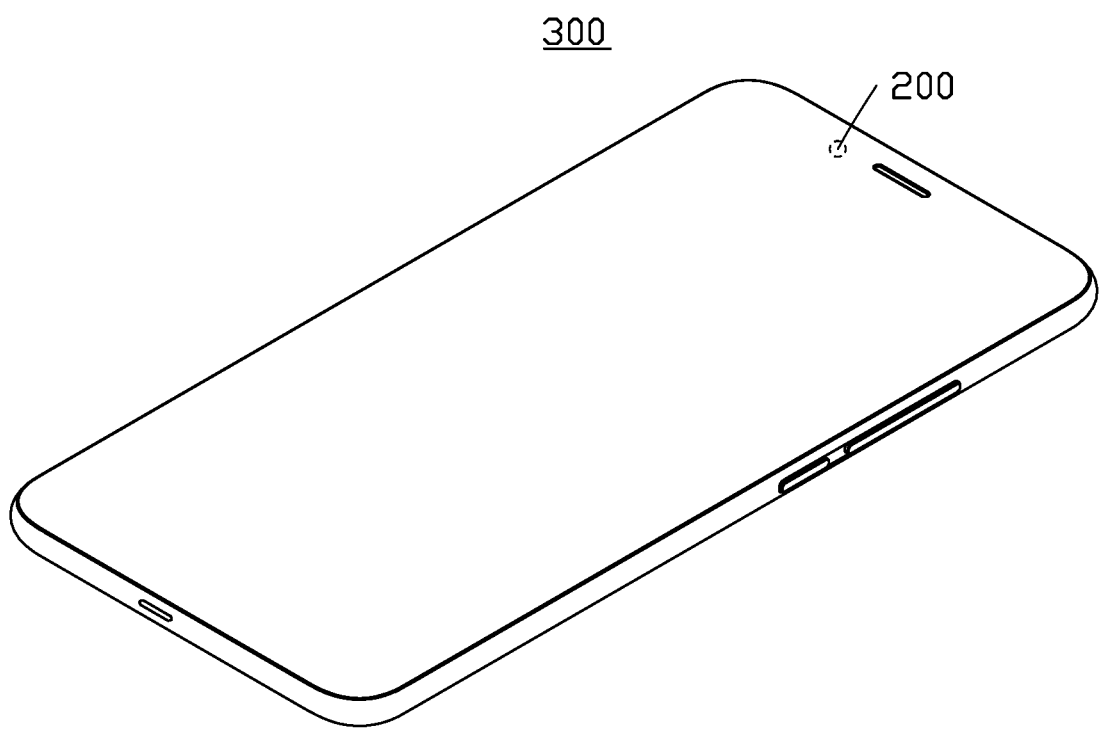
FIG. 8 is a diagrammatic view of an electronic device according to an embodiment of the present disclosure.

Referring to FIG. 8, an embodiment of the present application further provides an electronic device 300 including the lens module 200. The electronic device 300 may be, but not limited to, a mobile phone.

In the anisotropic conductive structure 100 of the present application, the first conductive particles 302 with a small particle size are arranged in the area corresponding to the electrical connection portion, and the second conductive particles 303 with a large particle size are arranged in the area outside the electrical connection portion. As such, the height difference caused by the electrical connection portion is balanced, which can prevent the tilt of the first element 10 and the second element 20 under an external force. Moreover, the height "a" of the first electrical connection portion 101, the height "b" of the second electrical connection portion 201, the diameter "R1" of the first conductive particle 302, and the diameter "R2" of the second conductive particle 303 satisfy the following formula: $R1\times60\%+a+b \leq R2 \leq R1\times70\%+a+b$. By limiting the lower limit of the diameter "R2" of the second conductive particles 303, the degree of tilt can be improved, and the first element 10 and the second element 20 can be evenly stressed, thereby allowing the external force to be evenly applied onto the first and second electrical connection portions 101, 201. Thus, the problem caused by the open circuit can be avoided. In addition, by limiting the upper limit of the diameter "R2" of the second conductive particles 303, the second conductive particles 303 are prevented from electrically connecting the areas other than the electrical connection portions of the first and second elements, thus avoiding a short circuit.

The above descriptions are some specific embodiments of the present application, but the actual application process cannot be limited only to these embodiments. For those of ordinary skill in the art, other modifications and changes made according to the technical concept of the present application should all belong to the protection scope of the present application.

What is claimed is:

1. An anisotropic conductive structure comprising:
a first element comprising a first electrical connection portion;
a second element comprising a second electrical connection portion opposite to the first electrical connection portion; and
an anisotropic conductive film arranged between the first element and the second element, wherein
the anisotropic conductive film electrically connects the first element to the second element,
the anisotropic conductive film comprises a first region and a second region connected to the first region, and the first region covers and corresponds to the first electrical connection portion and the second electrical connection portion,
the anisotropic conductive film further comprises an adhesive layer, a plurality of first conductive particles, and plurality of second conductive particles, the plurality of first conductive particles and the plurality of second conductive particles are distributed in the adhesive layer, the plurality of first conductive particles is located in the first region, and the plurality of second conductive particles is located in the second region, and
a diameter of each of the plurality of first conductive particles is denoted as R1, a diameter of each of the plurality of second conductive particles is denoted as R2, a height of the first electrical connection portion is denoted as a, a height of the second electrical connection portion is denoted as b, wherein R2>R1, and $R1\times60\%+a+b \leq R2 \leq R1\times70\%+a+b$.

2. The anisotropic conductive structure of claim 1, wherein the plurality of first conductive particles is arranged in the first region according to a first preset pattern, and the first preset pattern comprises a rectangle, a circle, an ellipse, a triangle, and a trapezoid.

3. The anisotropic conductive structure of claim 1, wherein the plurality of second conductive particles is arranged in the second region according to a second preset pattern, and the second preset pattern comprises a rectangle, a circle, an ellipse, a triangle, and a trapezoid.

4. The anisotropic conductive structure of claim 1, wherein the plurality of first conductive particles comprises gold, silver, tin, or indium.

5. The anisotropic conductive structure of claim 1, wherein the plurality of second conductive particles comprises gold, silver, tin, or indium.

6. The anisotropic conductive structure of claim 1, wherein the adhesive layer comprises epoxy resin, polymethyl methacrylate, or polyvinyl acetate.

7. The anisotropic conductive structure of claim 1, wherein the first element comprises a circuit board or a chip.

8. The anisotropic conductive structure of claim 1, wherein the second element comprises a circuit board or a chip.

9. A lens module comprising:
an anisotropic conductive structure comprising:
a first element comprising a first electrical connection portion, wherein the first element is one of a circuit board and a photosensitive chip;
a second element comprising a second electrical connection portion opposite to the first electrical connection portion, wherein the second element is another one of the circuit board and the photosensitive chip; and
an anisotropic conductive film arranged between the first element and the second element, wherein
the anisotropic conductive film electrically connects the first element to the second element; the anisotropic conductive film comprises a first region and a second region connected the first region, and the first region covers and corresponds to the first electrical connection portion and the second electrical connection portion,
the anisotropic conductive film further comprises an adhesive layer, a plurality of first conductive particles, and a plurality of second conductive particles, the plurality of first conductive particles and the plurality of second conductive particles are distributed in the adhesive layer, the plurality of first conductive particles is located in the first region, and the plurality of second conductive particles is located in the second region, and
a diameter of each of the plurality of first conductive particles is denoted as R1, a diameter of each of the plurality of second conductive particles is denoted as R2, a height of the first electrical connection portion is denoted as a, and a height of the second electrical connection portion is denoted as b, wherein R2>R1, and R1×60%+a+b≤R2≤R1×70%+a+b.

10. The lens module of claim 9, further comprising a lens, wherein the circuit board comprises a first surface and a second surface opposite to the first surface, and the lens is arranged on the first surface.

11. The lens module of claim 10, further comprising a filter, wherein a portion of the first surface is recessed toward the second surface to form a first groove, and the filter is arranged on a bottom surface of the first groove.

12. The lens module of claim 11, wherein a portion of the second surface is recessed toward the first surface to form a second groove, and the photosensitive chip is arranged on a bottom surface of the second groove.

13. The lens module of claim 12, wherein the circuit board defines a through hole, and the first groove and the second groove communicate with each other by the through hole.

14. The lens module of claim 9, wherein the plurality of first conductive particles is arranged in the first region according to a first preset pattern, and the first preset pattern comprises a rectangle, a circle, an ellipse, a triangle, and a trapezoid.

15. The lens module of claim 9, wherein the plurality of second conductive particles is arranged in the second region according to a second preset pattern, and the second preset pattern comprises a rectangle, a circle, an ellipse, a triangle, and a trapezoid.

16. The lens module of claim 9, wherein the plurality of first conductive particles comprises gold, silver, tin, or indium.

17. The lens module of claim 9, wherein the plurality of second conductive particles comprises gold, silver, tin, or indium.

18. The lens module of claim 9, wherein the adhesive layer comprises epoxy resin, polymethyl methacrylate, or polyvinyl acetate.

19. An electronic device comprising:
a lens module comprising an anisotropic conductive structure, the anisotropic conductive structure comprising:
a first element comprising a first electrical connection portion, wherein the first element is one of a circuit board and a photosensitive chip;
a second element comprising a second electrical connection portion opposite to the first electrical connection portion, wherein the second element is another of the circuit board and the photosensitive chip; and
an anisotropic conductive film arranged between the first element and the second element, wherein
the anisotropic conductive film electrically connects the first element to the second element; the anisotropic conductive film comprises a first region and a second region connected the first region, and the first region covers and corresponds to the first electrical connection portion and the second electrical connection portion,
the anisotropic conductive film further comprises an adhesive layer, a plurality of first conductive particles, and a plurality of second conductive particles, the plurality of first conductive particles and the plurality of second conductive particles are distributed in the adhesive layer, the plurality of first conductive particles are located in the first region, and the plurality of second conductive particles are located in the second region, and
a diameter of each of the plurality of first conductive particles is denoted as R1, a diameter of each of the plurality of second conductive particles is denoted as R2, a height of the first electrical connection portion is denoted as a, and a height of the second electrical connection portion is denoted as b, wherein R2>R1, and R1×60%+a+b≤R2≤R1×70%+a+b.

20. The electronic device of claim 19, wherein the plurality of first conductive particles is arranged in the first region according to a first preset pattern, and the first preset pattern comprises a rectangle, a circle, an ellipse, a triangle, and a trapezoid.

* * * * *